United States Patent [19]

Cedrone

[11] 4,047,780

[45] Sept. 13, 1977

[54] TEST CONTACTOR SYSTEM FOR SEMICONDUCTOR DEVICE HANDLING APPARATUS

[76] Inventor: Nicholas J. Cedrone, 10 Hawthorne Road, Wellesley Hills, Mass. 02181

[21] Appl. No.: 674,498

[22] Filed: Apr. 7, 1976

[51] Int. Cl.[2] .............................................. H05K 1/14
[52] U.S. Cl. ............................... 339/17 CF; 324/158 F; 339/74 R; 339/75 MP
[58] Field of Search ............ 339/17 CF, 74 R, 75 M, 339/75 MP; 324/158 F

[56] References Cited

U.S. PATENT DOCUMENTS

| | | | |
|---|---|---|---|
| 3,715,662 | 2/1973 | Richelmann | 324/158 F |
| 3,763,459 | 10/1973 | Millis | 339/75 M |
| 3,891,898 | 6/1975 | Damon | 339/17 CF |

FOREIGN PATENT DOCUMENTS

| | | | |
|---|---|---|---|
| 686,380 | 3/1965 | Italy | 339/75 M |

OTHER PUBLICATIONS

Ross, "Test Socket", IBM Technical Disclosure Bulletin, vol. 10, No. 5, Oct. 1967, p. 549.

Primary Examiner—Joseph H. McGlynn
Assistant Examiner—Mark S. Bicks
Attorney, Agent, or Firm—Kenway & Jenney

[57] ABSTRACT

A plurality of elongated bridging contacts each extending in a first direction are mounted on a pair of support blocks that are driven in a symmetrical, reciprocating motion between first and second limit positions. In the first position each contact makes electrical connection at one end with a lead of a semiconductor device to be tested and at the other end with a contact pin that is connected directly to a load board. The contacts are preferably pivotable to a limited degree about a point intermediate the contacting ends and flex slightly when in the first position to develop a good contact force. In the second position the contacts are spaced from the leads and the pins. Driving means for the support blocks, as well as the support blocks themselves, are structured to provide a minimum separation along the first direction between the load board and the device (preferably less than 25 millimeters) and an unrestricted mating plane for the load board. In a preferred form, the support blocks mount on a pair of opposed cross heads which in turn mount on a pair of slidable rods. The symmetrical, reciprocating motion is generated by spring means that urges the cross heads together and cam means, acting through a pivoted arm linked to both slide rods, that urge the cross heads apart.

9 Claims, 6 Drawing Figures

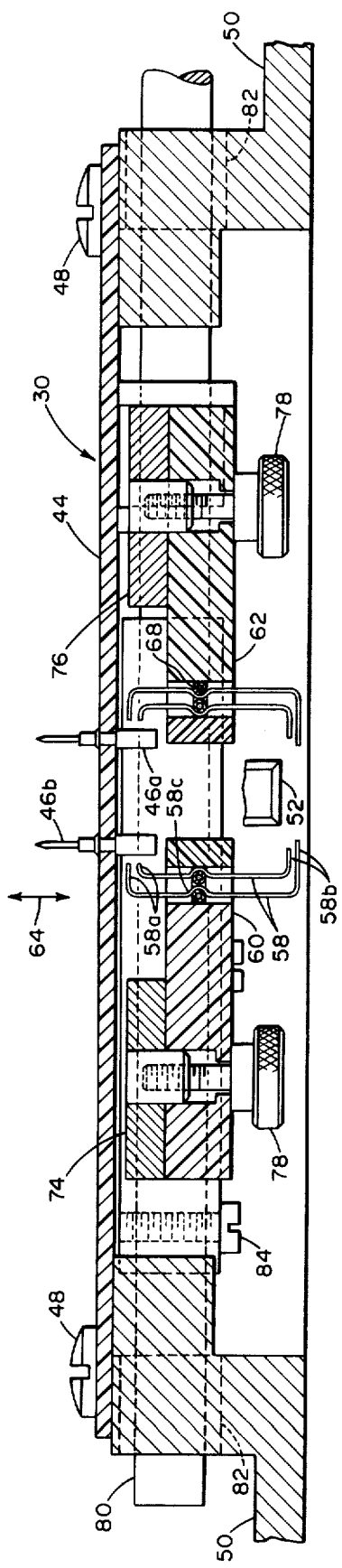

TEST CONTACTOR SYSTEM FOR SEMICONDUCTOR DEVICE HANDLING APPARATUS

BACKGROUND OF THE INVENTION

This invention relates generally to apparatus for handling, sorting and testing electronic components and more particularly to a system for reliably making and breaking electrical connection, at a high repetition rate, between leads of a semiconductor device and contact pins in electrical connection with a load board.

In the manufacture of electronic components, particularly semiconductor devices such as digital integrated circuits (IC's), it is highly desirable to test each device before it is shipped and/or incorporated in a larger product. Production economics require that this handling and testing be accomplished at extremely high rates. Typical operating rates are in excess of 5,000 devices per hour. When operating at these speeds, testing of the device must be accomplished within an extremely short period of time, typically 100 milliseconds. Further, it is extremely important to have an accurate, precise, and reliable test. An increase in the uncertainty of the test also increases the likelihood of misclassifying a device that is, classifying as good a device that is in fact defective, or classifying as defective a device that is in fact good.

In the testing of three classes of semiconductor devices, digital fast switch devices such as bipolar circuits, digital clock rate devices such as high speed counters, and linear devices which operate at radio frequencies such as detectors for FM tuners, the physical separation between the device being tested and the test circuit of "load board" can significantly limit the precision and reliability of the test.

In digital applications, increases in the length of the conductive elements that connect a lead on the device to a corresponding pin connected to the load board can degrade the shape of the test signal and therefore the precision and accuracy of the test measurement. Increased contactor length also increases the time for a pulse to travel through the contact and therefore lowers the permissible repetition rate of the interrogating test pulses. A limitation on the pulse repetition rate can be a serious problem whenever a test procedure requires a large number of test pulses, as in the testing of memory devices where each of perhaps millions of addresses must be interrogated. At high frequencies long contacts can also enhance the problem of reflected signals since the time required to wait for the reflection to dissipate can severely limit the speed of the test.

In the testing of linear devices such as detectors for FM tuners, the test must be performed "in-situ," that is, in the actual end use environment. Ideally a device to be tested is manually connected in the actual circuit. Since this is very time consuming, it has been found acceptable to test the device close to the actual end use circuit. Generally the separation between actual circuit, simulated by a load board or test fixture, and the point of connection to the leads on the device must be no more than approximately one inch or 25.4 millimeters. Where the test fixture has relatively large physical dimensions, the difficulties in achieving this degree of closeness are complicated by the further requirement that the electrical connection must be made while presenting to the test fixture an essentially unrestricted mating surface or "load plane."

While prior art devices having relatively short test contacts and an unrestricted load plane are known in the art, they suffer from various disadvantages. These connection systems are characterized by flexible contacts that have one end fixed, typically the end in direct electrical connection with the load board, while the free ends are flexed into or out of contact with the leads on the device. One such system utilizes a pair of opposed contact arms that are urged against an interposed lead by a spring force inherent in the contact arm. Connection is broken by a rotating cam element also located between each contact arm pair. This system suffers from a relatively low contact force on the leads, metal fatigue of the arms at the bend point near fixed ends, poor contact location on the leads (on the tip or free end rather than on the shoulder adjacent the device), and a reduced ability to cope with normally occurring variations in the location of the leads.

Another system pushes the contacts, usually in spaced pairs, laterally into connection with the leads against an inherent spring force of the contacts that urges them away from the leads. While this system lends itself to a shoulder connection on the leads, it also suffers from a bending fatigue in the contact arms. This system also does not achieve a consistently good, high force contact at both connections over a range of lead positions normally encountered. Another related problem with both of these "fixed-end" systems is that arrangements that tend to reduce the bending and/or enhance the contact force are more likely to cause severly misaligned leads to catch on the contacts and interrupt the entire testing and handling process.

It is therefore a principal object of this invention to provide a test contactor system for a high speed semiconductor handler that has relatively short contacts and provides an unlimited load plane, while minimizing the problem of metal fatigue, providing a high contact force over a wide range of lead positions, and establishing contact with the lead at the shoulder location.

Further objects of the invention are to provide a test contact system with the aforesaid advantages that operates in a precisely controlled fashion, allows the contacts to be conveniently changed or repositioned with respect to the load board, and has a long operational life.

SUMMARY OF THE INVENTION

A plurality of double break contacts extending generally in a first direction are mounted on support means movable in a direction generally transverse to that of the contacts to achieve a rapid cycled electrical connection between a succession of semiconductor devices, typically having a dual, in-line lead configuration, and a contact pin array in direct electrical connection with a load board. Drive means move the support means and the contacts in a precisely controlled, symmetrical reciprocating manner while being structured to minimize the separtion between the device and the load board and present an unlimited mating surface or load plane to the load board. Preferably the separation between the load plane and the point of electrical connection on the shoulder of the leads is approximately 20 millimeters (0.8 inch). The support means move between a first limit position, in which the contacts each make electrical connection at one of its ends with a lead and at the other of its ends with a contact pin, and a second limit position in which the contacts and the support means are clear of the leads and the pins.

In a preferred form, the contacts are pivotable, at least to a limited degree, about a point intermediate its ends to accommodate variations in the location of the leads and/or pins. The contacts also are preferably organized in nested, spaced apart pairs (bifurcated) and flex somewhat when in the first position to develop a good contact force and to generate a slight wiping action that removes foreign matter such as an oxide film from the contacting surfaces. The drive means preferably includes cam means acting on a pivoted arm linked to a pair of slidable rods that carry a set of opposed cross heads. The cam action is opposed by means urging the cross heads together toward the first limit position.

These and other features and advatages of this invention will be more fully understood from the following detailed description of the preferred embodiments which should be read in conjunction with the accompanying drawings.

BRIEF DESCRIPTION OF THE DRAWINGS

FIG. 2 is a view in front elevation with portions broken away of a test contactor system used in the apparatus shown in FIG. 1 and constructed according to the invention;

FIG. 3 is an enlarged sectional view taken along the line 3—3 of FIG. 2;

DETAILED DESCRIPTION OF THE PREFERRED EMBODIMENTS

Figure 1:
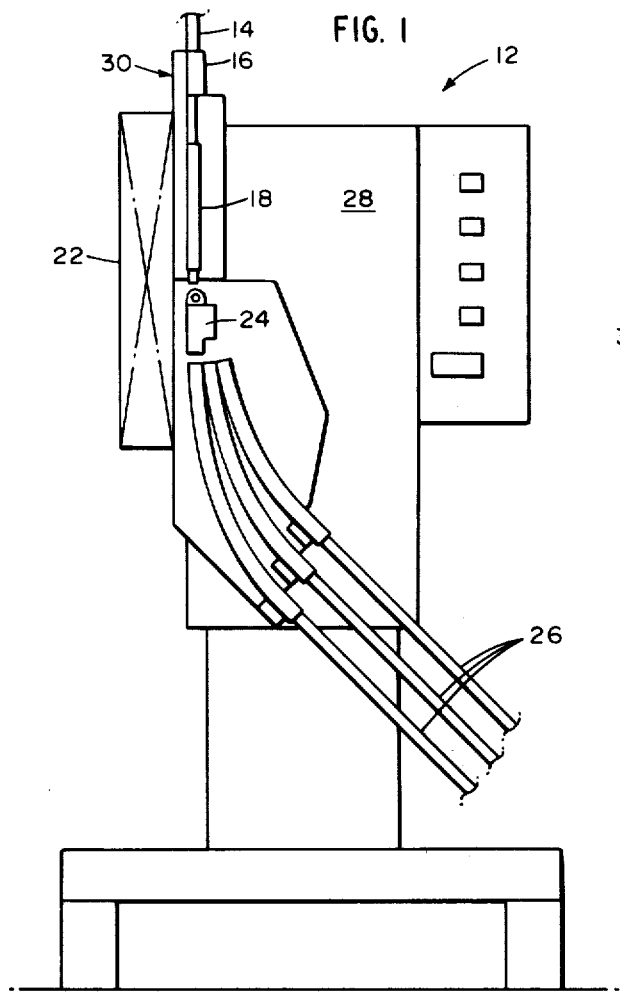
FIG. 1 is a highly simplified view in front elevation of a semiconductor device test handling and sorting apparatus that incorporates the invention.

FIG. 1 shows an automatic, high speed, semiconductor device test handling and sorting appartus 12 that receives semiconductor devices such as integrated circuits (IC's) and the like from a stick 14 held at its lower end in a stick mounting assembly 16 that serves to direct the devices to a feeding and testing assembly 18. The assembly 18 automatically feeds the devices, one at a time, at a preferred rate of approximately 6,000 IC's per hour, to a test site. Each device comes to a full stop at the test site while a test contactor system 20 (FIGS. 2-5) constructed according to this invention electrically connects each lead of the device to a test circuit 22 and the test is performed. For many devices, the tests are performed within 100 milliseconds, but larger periods of time can be required for certain devices such as memories. While the test circuit is commonly in the form of a printed circuit board, in some instances it may be a relatively large, bulky test fixture as shown in FIG. 1. In the present description, the term "load board" will refer to the test circuit, whether in the form of a printed circuit board or a large test fixture.

Following the test, the device drops to a sorter 24 which directs it to a selected output or receiving stick 26. To provide uninterrupted operation, each stick 14 or 26 is usually in a tandem pair of sticks so that one stick of each pair can be replaced while the other stick continues to supply or receive devices.

The geometry of the test handling and sorting apparatus 12 is significant in several respects. First, devices are fed to the test site and sorter 24 in a substantially vertical fall path. The advantages of vertical feed, and a description of aparatus suitable for bringing the falling devices, which may have different masses, to a rapid, bounce-free stop at the test site is described in applicant's copending application Ser. No. 596,304, filed July 16, 1975, now U.S. Pat. No. 4,000,798, a continuation of application Ser. No. 457,811 filed Apr. 4, 1974, now abandoned the disclosures of which are herewith incorporated by reference. Second, it should be noted that the test contactor system 20 and the associated support members are oriented at substantially a right angle to the front face 28 of the apparatus 12. This arrangement presents an unrestricted or unlimited mating surface 30 to the test fixture 22 which allows even large, bulky test circuits to be brought into close physical proximity to the devices at the test site.

Figure 6:
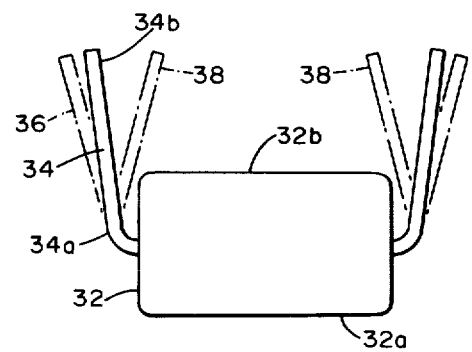
FIG. 6 is an enlarged view of the semiconductor device corresponding to FIG. 5 showing variations in the location of the leads.

With reference to FIG. 6, it is also significant to note the geometry of a typical semiconductor device 32. The device 32, which may be a linear analog device such as a detector for a television or FM tuner, or a digital device such as a high speed counter or a logic or memory circuit, is usually packaged in the form of a generally rectangular plastic block having an aligned set of leads 34 projecting from each sides of the device 32. Such devices are commonly termed "DIP's." The portion 34a of the leads adjacent the body of the device 32 is commonly termed the shoulder and the free end 34b is commonly termed the tip. Each lead is typically angled to extend in the direction that forms an angle of 0° to 15° with the normal to the top or bottom face 32a or 32b, respectively, of the device 32. The degree of variation in the location of the leads is within industry standards for the dimensions and configurations of DIP's. A lead 36 shown in phantom in FIG. 6 illustrates the approximate position of a lead at a maximum 15° angle. In contrast, the lead 34 shown in solid lines illustrates a more common location of the leads. It will be understood, of course, that one or more leads on a given device may become bent so as not to fall in this accepted range of angles as is illustrated by the leads 38 shown in phantom.

Figure 4:
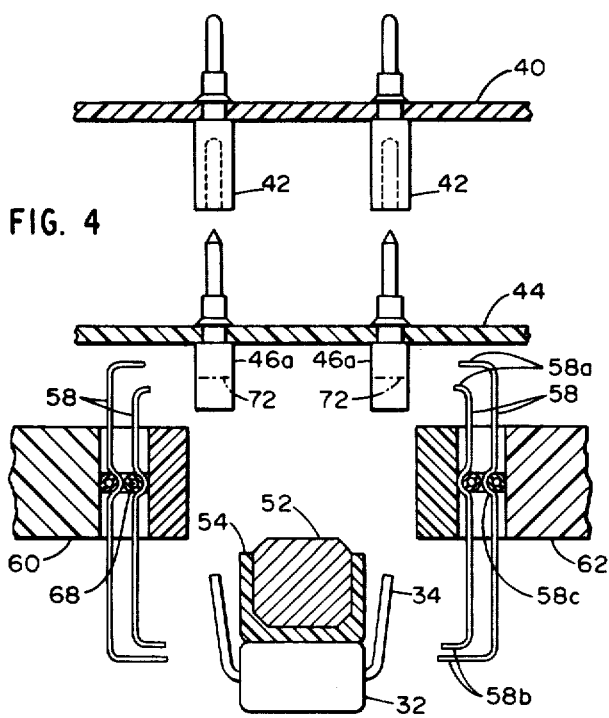
FIG. 4 is a detailed view corresponding to FIG. 3 showing the relationship of the contacts, the leads and the contact pins when the contact support means is in the second limit position.
Figure 5:
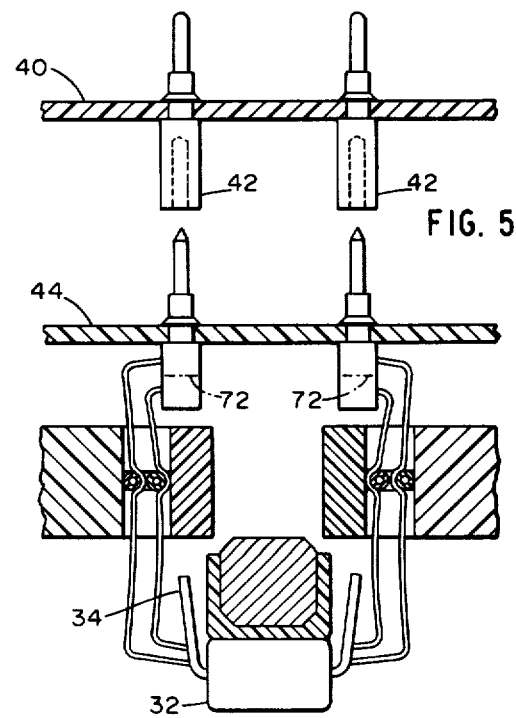
FIG. 5 is a view corresponding to FIG. 4 showing the contacts in electrical connection with the leads and pins when the support means is in the first limit position.

FIGS. 2-5 illustrate a preferred embodiment of a test contactor system constructed according to the invention for reliably making and breaking electrical connection between the lead 34 of the semiconductor device 32 and a load board 40. Contact pins 42 on the load board 40 provide a convenient mode of connection to other circuit elements. While the load board 40 can be placed in direct electrical connection with the device 32, it is common to utilize an intermediate probe board 44 having an array of contact pins 46. A portion 46a of the pins 46 is located on the side of the probe board facing the device 32. A portion 46b is located on the opposite side of the probe board, and is adapted to plug into corresponding pins 42 on the load board. (While the load board 40 is shown in FIGS. 4 and 5 as spaced from the probe board 44, it will be understood that in operation these boards are closely spaced from one another or in actual contact.) It should also be noted that the contact pins 46 may have a standard "coaxial" structure to divide each pin portion 46a into two separate independent conductive areas as suggested by the dashed lines 72 (FIGS. 4 and 5). Each of these areas is associated with a separate connection site on the opposite side of the probe board.

The probe board is held in a fixed position with respect to the connection system 20 by mounting screws 48 which thread into a support plate 50. This mounting arrangement allows a convenient interchange of probe boards to interface between the contactor system 20 and load boards having various arrays of connecting pins 42. The device 32 is positioned with respect to the connecting system by a vertically extending rail 52 having an outer insulating sleeve 54 adjacent the device 32 and the leads 34. The conductor 32 is brought to a rapid, bounce-free stop at a test site indicated generally at 56 in the manner described in said aforementioned copending applications.

Bridging contacts 58, arranged in nested, spaced-apart pairs, are held in opposed support blocks 60 and 62 formed from a suitable insulating material. Each contact 58 extends generally in a first direction indicated by the arrow 64 (FIG. 3). The contact pairs on each block 60 and 62 are aligned in a second direction, indicated by the arrow 66 (FIG. 2), and spaced along this second direction to align one pair of contacts 58 with one lead 34 of the device 32 at rest at the test site. The free ends 58a and 58b of each contact 58 are bent at generally a right angle to the first direction to facilitate the establishment of a good electrical contact between the ends 58a and the contact pin portions 46a and the free ends 58b and the leads 34, respectively. At a point intermediate the end portions 58a and 58b, each contact has an arcuate portion 58c that rests on a similarly curved, insulated rod 68 extending generally in the second direction. The rod 68 control the spacing between the paired contacts, fix the position of the contacts within the support blocks 60 and 62, and allow each contact to pivot to a limited degree about the rods.

The support blocks 60 and 62, and the contacts 58 mounted on the support blocks, move in a precisely controlled, symmetrical, reciprocating motion in a third direction, indicated by the arrow 70 (FIG. 2), that is generally orthogonal to both the first and second directions. The symmertrical nature of the movement of the blocks 60 and 62 between the limit positions of the reciprocating motion is illustrated by a comparison of FIGS. 4 and 5. In FIG. 5 the blocks 60 and 62 are in a first limit position in which the contacts 58 are placed in electrical connection with the shoulder portions 34a of the leads 34 and the contact pin portions 46a. In this position the contacts close the electrical circuit between the load board and the device 32 to be tested. Also, the contacts are slightly flexed, which, due to their inherent resiliency, generates a spring force that promotes a good electrical connection. It should be noted that the flexing is taken up over a substantial portion of each contact and therefore is less likely to produce metal fatigue than a more severe bending over a more limited area. It should also be noted that connection at the shoulder of the leads, as opposed to the tip, and the ability of the contacts to pivot about the rods are conducive to the establishment of good electrical connections with the leads even when they fail to meet accepted standards for the lead location. Further, the use of nested pairs of contacts (bifurcated contacts) allows them to be operated as Kelvin pairs when the contact pins portions 46a are made coaxial. In this mode of operation, each contact 58 of the pair can measure independently the current and the voltage.

FIG. 4 shows the support blocks 60 and 62 in the second limit position in which the ends 58a and 58b of each contact are spaced from the leads and contact pins. The contacts are "double break" since electrical connection is broken at both the contact pins and the leads, in contrast to the situation where one end of each contact is fixed and continuously connected to the load board. A significant advantage of the present connection system is that when connection is broken the contacts 58 are spaced far enough from the leads 34 to ensure clearance for even severely misformed devices 32 while at the same time not detracting from the contact force during electrical connection or severely bending the contacts.

A preferred arrangement for supporting and driving the contact blocks 60 and 62 in the aforedescribed manner is shown in FIGS. 2 and 3. The blocks 60 and 62 are mounted on an opposed pair of cross heads 74 and 76 by means of screws 78. The cross heads are carried on a pair of substantially parallel rods 80 and 81 that are slidable in bushings 82 secured in the frame 50. The cross head 74 is secured by screws 84 to the rod 80 and is slidably engaged over on the rod 81 through a bushing 86. The cross head 76 is similarly mounted except that it is secured by screws 84 to the rod 81 and slidably engaged on the rod 80. A pair of springs 88 connect the cross heads 74 and 76 and urge them and the blocks 60 and 62 toward the first limit position.

A rotating cam 90 drives the cross heads and support blocks to the second limit position against the force of the springs 88. A cam follower 92 having freely rotatable wheels 94 and 95 mounted at its ends translates variations in the peripheral surface of the cam into a linear movement of the cam follower along the third direction. A spring 96 urges the cam follower 92 to remain in contact with the cam 90. An arm 98 pivotable about a pin 100 located substantially midway between the rods 80 and 81 is also pivotally linked to the adjacent ends of the rods. Since the cam follower wheel 95 bears on the arm 98 through a contact member 102, a linear movement of the cam follower 92 is translated into a corresponding, symmetrical, linear movement of the rods 80 and 81, with the rods moving in opposite directions. Through a proper selection of the dimensions and shape of the cam surface and the dimensions of the connecting members, it is possible to precisely and accurately control both the time the support blocks remain at the first and second limit positions and their travel distance between the limit positions measured along the third direction.

Another significant aspect of this invention is that the desired symmetrical, reciprocating movement of the contacts is developed within an extremely limited space measured along the first direction. This structural feature is important in minimizing the load board to shoulder contact separation. In the preferred form, this separation is less than 25.4 millimeters (one inch) and preferably approximately 20 millimeters (0.8 inch). Another important result of this structural feature is that the test contactor system 20, as well as the entire apparatus 12, presents unlimited load plane (extending in the second and third directions) that facilitate the placement of the large, bulky test fixture 22 in close physical proximity to the device being tested.

While the invention has been described hereinabove in context of handling, sorting and test apparatus in which a succession of the devices 32 fall in a generally vertical direction to the test site, it will be understood that it is contemplated that the invention can be used in conjunction with apparatus that feeds and removes the devices from the test sites in other modes. Further, although the device has been described as having bifurcated contacts connecting to DIP's, the invention can be used with single contacts and the devices having alternative configurations. These and various other modifications of the invention will become apparent to those skilled in the art from the foregoing description and the accompanying drawings. Such modifications are intended to fall within the scope of the appended claims.

I claim:

1. Means for reliably making and breaking electrical connection at a high repetition rate between a succession of electronic devices, each having a plurality of leads extending generally in a first direction, and a load board in electrical connection with a like plurality of pins spaced from said leads along said first direction, comprising, in combination, a plurality of contacts, means for supporting said contacts so that each contact extends generally in said first direction, said support means being movable between first and second limit positions spaced from one another along a third direction transverse to said first direction, and each of said contacts being positioned on said support means to make electrical connection between one of said leads and one of said pins when said support means is in said first limit position and to break electrical connection with both said one of said leads and said one of said pins when said support means is in said second limit position, said limit position spacing being sufficiently large that said contacts in said second limit position avoid connection with said leads while allowing a wide degree of variation in the location of said leads measured in said third direction, and means for driving said means in a precisely controlled, symmetrical movement between said first and second limit positions, said driving means and said support means being structured so that their surfaces adjacent said load board are unlimited in a plane substantially perpendicular to said first direction and they extend in said first direction for a distance comparable to that of said contacts to minimize the spacing between said device and said load board.

2. Electrical connection means according to claim 1 in which said support means comprises a pair of blocks that each hold a set of said contacts aligned generally along a second direction orthogonal to said first and third directions, said blocks being mutually spaced along said third direction.

3. Electrical connection means according to claim 2 in which each of said contacts are pivotable in said blocks at an interior portion of each contact to accommodate variations in the location of said leads and said pins.

4. Electrical connection means according to claim 3 in which each of said contacts is flexible over a substantial portion of its length to develop a spring force that urges said contacts into electrical connection with said leads and said pins when said blocks are in said first limit position while minimizing metal fatigue.

5. Electrical connection means according to claim 4 in which two of said contacts are in electrical connection between one of said leads and one of said pins and the ends of each of said contacts are angled to make electrical connection with said leads and said pins in an abutting engagement.

6. Electrical connection means according to claim 2 in which said drive means comprises, a frame, a pair of substantially parallel, spaced apart guide rods slidably engaged in said frame and extending in said third direction, an opposed pair of cross heads each secured to a different one of said rods and slidably engaged on the other of said rods, means for securing said support blocks to said cross heads, means for urging said cross heads towards one another to place said support blocks in said first limit position, and means for periodically urging said cross heads apart to place said support blocks in said second limit position.

7. Electrical connection means according to claim 6 in which said means for urging said cross heads apart comprises a link arm pivotally connected to said rods and pivotal about a fixed point intermediate said rods and cam means operatively connected to said link arm.

8. Electrical connection means according to claim 1 in which said contacts make electrical connection with said leads at a point on said leads adjacent said device when said support means are in said first limit position.

9. Electrical connection means according to claim 8 in which the spacing between said unlimited surfaces and the point of electrical connection between said contacts and said leads, measured in said first direction, is less than 25.4 millimeters.

* * * * *